United States Patent
Chen et al.

(10) Patent No.: US 11,468,863 B2
(45) Date of Patent: Oct. 11, 2022

(54) GATE DRIVING CIRCUIT, GATE DRIVING DEVICE AND SPLICED DISPLAY

(71) Applicants: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

(72) Inventors: Po-Lun Chen, Guangdong (CN); Chun-Ta Chen, Guangdong (CN); Chih-Lin Liao, Guangdong (CN); Fu-Cheng Wei, Guangdong (CN); Po-Tsun Liu, Guangdong (CN); Guang-Ting Zheng, Guangdong (CN); Ping-Hung Hsieh, Guangdong (CN)

(73) Assignees: Interface Technology (ChengDu) Co., Ltd., Sichuan (CN); Interface Optoelectronics (ShenZhen) Co., Ltd., Guangdong (CN); Interface Optoelectronics (Wuxi) Co., Ltd., Jiangsu (CN); General Interface Solution Limited, Miaoli County (TW)

( * ) Notice: Subject to any disclaimer, the term of this patent is extended or adjusted under 35 U.S.C. 154(b) by 0 days.

(21) Appl. No.: 17/199,471

(22) Filed: Mar. 12, 2021

(65) Prior Publication Data
US 2022/0246107 A1    Aug. 4, 2022

(30) Foreign Application Priority Data
Feb. 4, 2021 (CN) .......................... 202110153895.2

(51) Int. Cl.
*G09G 3/36* (2006.01)

(52) U.S. Cl.
CPC ..... *G09G 3/3696* (2013.01); *G09G 2310/0251* (2013.01); *G09G 2310/08* (2013.01)

(58) Field of Classification Search
CPC ......... G09G 2310/0286; G09G 3/3677; G09G 3/3266; G09G 3/3674
See application file for complete search history.

(56) References Cited

U.S. PATENT DOCUMENTS

| | | | | |
|---|---|---|---|---|
| 2008/0079685 A1* | 4/2008 | Umezaki | ............. | H01L 27/1225 345/100 |
| 2010/0188385 A1* | 7/2010 | Boiko | ................. | G11C 19/184 377/68 |

(Continued)

*Primary Examiner* — Van N Chow
(74) *Attorney, Agent, or Firm* — CKC & Partners Co., LLC (57) ABSTRACT

A gate driving circuit includes a bootstrapping circuit, a pre-charge circuit, and an output control circuit. The bootstrapping circuit is composed of a bootstrapping capacitor and a transistor. A first terminal of the bootstrapping capacitor has a first voltage during a first duration. The pre-charge circuit is connected to the first terminal of the bootstrapping capacitor. The pre-charge circuit boosts the first terminal of the bootstrapping capacitor from the first voltage to a second voltage during a second duration. The bootstrapping circuit boosts the first terminal of the bootstrapping capacitor from the second voltage to a third voltage during a third duration. The output control circuit is connected to the first terminal of the bootstrapping capacitor. The output control circuit boosts the first terminal of the bootstrapping capacitor from the third voltage to a fourth voltage during a fourth duration.

19 Claims, 6 Drawing Sheets

(56) References Cited

U.S. PATENT DOCUMENTS

2012/0087459 A1* 4/2012 Nakamizo ............ G11C 19/184
                                                        377/64
2018/0108309 A1* 4/2018 Tanaka ................ G09G 3/3648
2021/0358404 A1* 11/2021 Hu ...................... G09G 3/3233

* cited by examiner

GATE DRIVING CIRCUIT, GATE DRIVING DEVICE AND SPLICED DISPLAY

RELATED APPLICATIONS

This application claims priority to China Application Serial Number 202110153895.2, filed Feb. 4, 2021, the disclosures of which are incorporated herein by reference in their entireties.

BACKGROUND

Field of Invention

The present invention relates to a gate driving circuit. More particularly, the present invention relates to a gate driving circuit of a display device, a gate driving device, and a spliced display.

Description of Related Art

Thin Film Transistor Liquid Crystal Displays (TFT LCDs) have become the mainstream of the display products. TFT-LCDs are applied in mobile phones and are lightweight and easy to carry. In comparison with Poly-Si TFT LCDs, the production cost of the a-Si TFT LCDs is low, and the a-Si TFT LCDs can be fabricated on a large-area glass substrate at low temperature. The a-Si TFT LCDs have high uniformity and high dependence and can increase the production rate.

With the concept of System-on-Glass (SOG) being proposed, in recent years, each of many display products integrates the display driver circuit (e.g., gate drivers or scan drivers) on the glass substrate, i.e., the gate driver on array (GOA) circuit. The GOA circuit has many advantages, not only can reduce the area of the border of the display to achieve the display with a narrow border, but also can reduce the number of the gate scan drive integrated circuits (ICs), thereby reducing the cost of the ICs and avoiding disconnection problem when bonding the glass substrate and ICs, so as to improve product yield. At present, the GOA circuit has been widely applied in small-sized or medium-sized display products (e.g., mobile phones, notebook computers, etc.), and even the application of GOA can be seen in large-sized display products.

At present, the design of borders of display products is becoming narrower, while the design of vehicle displays is becoming large-sized. Therefore, the combination of the large-sized displays and the narrow border displays becomes the trend of the entire industry and the realization of the said combination is also a common problem faced by all display products. In terms of design, it is hoped that several mechanisms can be used to reduce the number of transistors so as to save unnecessary layout area.

In addition, in order to achieve good image quality, the screen resolution must be improved. In such case, the turn-on time of each scan line will be shortened, but the carrier mobility of a-Si is relatively low. Thus, the reliability target that needs to be considered is to improve the driving capability of the gate driving circuit while passing the stress test at high temperatures (e.g., 85° C.).

As discussed above, there is a need to design a gate driving circuit with a smaller layout area and high reliability to extreme temperature.

SUMMARY

The present invention provides a gate driving circuit including a bootstrapping circuit, a pre-charge circuit, and an output control circuit. The bootstrapping circuit is composed of a bootstrapping capacitor and a transistor. A first terminal of the bootstrapping capacitor has a first voltage during a first duration. The pre-charge circuit is connected to the first terminal of the bootstrapping capacitor. The pre-charge circuit boosts the first terminal of the bootstrapping capacitor from the first voltage to a second voltage during a second duration. The bootstrapping circuit boosts the first terminal of the bootstrapping capacitor from the second voltage to a third voltage during a third duration. The output control circuit is connected to the first terminal of the bootstrapping capacitor. The output control circuit boosts the first terminal of the bootstrapping capacitor from the third voltage to a fourth voltage during a fourth duration.

In accordance with one or more embodiments of the invention, the pre-charge circuit includes a first transistor. A first terminal of the first transistor is connected to the first terminal of the bootstrapping capacitor.

In accordance with one or more embodiments of the invention, the gate driving circuit further includes a discharge circuit including a second transistor. A first terminal of the second transistor is connected to the first terminal of the bootstrapping capacitor. A second terminal of the second transistor receives a first low system voltage.

In accordance with one or more embodiments of the invention, the output control circuit includes a third transistor. A control terminal of the third transistor is connected to the first terminal of the bootstrapping capacitor and a first terminal of the third transistor receives a first clock signal, such that the third transistor generates a gate driving signal at a second terminal of the third transistor.

In accordance with one or more embodiments of the invention, the transistor of the bootstrapping circuit is a fourth transistor. A second terminal of the bootstrapping capacitor is connected to a first terminal of the fourth transistor.

In accordance with one or more embodiments of the invention, the gate driving circuit further includes a first anti-noise circuit including a fifth transistor and a sixth transistor. A first terminal of the fifth transistor and a first terminal of the sixth transistor are connected to the second terminal of the third transistor. A second terminal of the fifth transistor and a second terminal of the sixth transistor receive the first low system voltage. A control terminal of the fifth transistor is connected to a first node. A control terminal of the sixth transistor is connected to a second node.

In accordance with one or more embodiments of the invention, the gate driving circuit further includes a first negative bias compensation circuit including a seventh transistor and an eighth transistor. A first terminal and a control terminal of the seventh transistor receive a second clock signal. A second terminal of the seventh transistor and a first terminal of the eighth transistor are connected to the first node. A control terminal of the eighth transistor receives a third clock signal. A second terminal of the eighth transistor receives a second low system voltage.

In accordance with one or more embodiments of the invention, the second low system voltage is less than the first low system voltage.

In accordance with one or more embodiments of the invention, the gate driving circuit further includes a second anti-noise circuit including a ninth transistor. A first terminal of the ninth transistor is connected to the first terminal of the bootstrapping capacitor. A second terminal of the ninth transistor receives the first low system voltage. A control terminal of the ninth transistor is connected to the second node.

In accordance with one or more embodiments of the invention, the gate driving circuit further includes a second negative bias compensation circuit including a tenth transistor, an eleventh transistor and a twelfth transistor. A first terminal and a control terminal of the eleventh transistor receive the first clock signal. A first terminal of the tenth transistor, a second terminal of the eleventh transistor and a first terminal of the twelfth transistor are connected to the second node. A second terminal of the tenth transistor and a second terminal of the twelfth transistor receive the second low system voltage. A control terminal of the twelfth transistor receives the second clock signal.

In accordance with one or more embodiments of the invention, during the first duration, the first transistor is turned on such that the first terminal of the bootstrapping capacitor has the first voltage.

In accordance with one or more embodiments of the invention, during the second duration, the first transistor is turned on and a high voltage level is provided to a second terminal of the first transistor such that the first terminal of the bootstrapping capacitor is boosted from the first voltage to the second voltage.

In accordance with one or more embodiments of the invention, during the third duration, a high voltage level is provided to a second terminal of the fourth transistor such that the first terminal of the bootstrapping capacitor is boosted from the second voltage to the third voltage.

In accordance with one or more embodiments of the invention, during the fourth duration and a fifth duration, the first terminal of the third transistor receives the first clock signal with a high voltage level such that the first terminal of the bootstrapping capacitor is boosted from the third voltage to the fourth voltage.

In accordance with one or more embodiments of the invention, during the fourth duration and the fifth duration, the ninth transistor is configured to maintain the fourth voltage that the first terminal of the bootstrapping capacitor has.

In accordance with one or more embodiments of the invention, during a sixth duration, the first terminal of the third transistor receives the first clock signal with the first low system voltage such that the first terminal of the bootstrapping capacitor is pulled down from the fourth voltage to the third voltage.

In accordance with one or more embodiments of the invention, during a seventh duration, a control terminal of the second transistor is at a high voltage level to turn on the second transistor such that the first terminal of the bootstrapping capacitor is pulled down from the third voltage to the first voltage.

In accordance with one or more embodiments of the invention, during the sixth duration and the seventh duration, the ninth transistor is turned off such that the ninth transistor performs negative bias compensation.

In accordance with one or more embodiments of the invention, during a eighth duration and a ninth duration, the first terminal and the control terminal of the eleventh transistor receive the first clock signal with a high voltage level to turn on the ninth transistor such that the first terminal of the bootstrapping capacitor is pulled down to the first low system voltage so as to prevent noise generation, wherein during the eighth duration and the ninth duration, the fifth transistor is turned off such that the fifth transistor performs negative bias compensation.

The present invention further provides a gate driving device including a multi-stage of gate driving circuit. The multi-stage of gate driving circuit is composed of plural gate driving circuits for respectively generating plural gate driving signals. Nth-stage of gate driving circuit includes a bootstrapping circuit, a pre-charge circuit, and an output control circuit. The bootstrapping circuit is composed of a bootstrapping capacitor and a transistor. A first terminal of the bootstrapping capacitor has a first voltage during a first duration. The pre-charge circuit is connected to the first terminal of the bootstrapping capacitor. The pre-charge circuit boosts the first terminal of the bootstrapping capacitor from the first voltage to a second voltage during a second duration. The bootstrapping circuit boosts the first terminal of the bootstrapping capacitor from the second voltage to a third voltage during a third duration. The output control circuit is connected to the first terminal of the bootstrapping capacitor. The output control circuit boosts the first terminal of the bootstrapping capacitor from the third voltage to a fourth voltage during a fourth duration. N is a positive integer greater than 1.

The present invention further provides a spliced display including plural display panels disposed within a display region of the spliced display. The display panels are spliced to each other. Each of the display panels has a gate driving device. The gate driving device includes a multi-stage of gate driving circuit composed of plural gate driving circuits for respectively generating plural gate driving signals. Nth-stage of gate driving circuit includes a bootstrapping circuit, a pre-charge circuit, and an output control circuit. The bootstrapping circuit is composed of a bootstrapping capacitor and a transistor. A first terminal of the bootstrapping capacitor has a first voltage during a first duration. The pre-charge circuit is connected to the first terminal of the bootstrapping capacitor. The pre-charge circuit boosts the first terminal of the bootstrapping capacitor from the first voltage to a second voltage during a second duration. The bootstrapping circuit boosts the first terminal of the bootstrapping capacitor from the second voltage to a third voltage during a third duration. The output control circuit is connected to the first terminal of the bootstrapping capacitor. The output control circuit boosts the first terminal of the bootstrapping capacitor from the third voltage to a fourth voltage during a fourth duration. N is a positive integer greater than 1. A power bus disposed within a border region of the spliced display is composed of a first power bus line and a second power bus line. The first power bus line provides the first voltage to the display panels. The second power bus line provides a low system voltage lower than the first voltage to the display panels.

In order to let above mention of the present invention and other objects, features, advantages, and embodiments of the present invention to be more easily understood, the description of the accompanying drawing as follows.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Specific embodiments of the present invention are further described in detail below with reference to the accompanying drawings, however, the embodiments described are not intended to limit the present invention and it is not intended for the description of operation to limit the order of implementation. The using of "first", "second", "third", etc. in the specification should be understood for identify units or data described by the same terminology, but are not referred to particular order or sequence.

Figure 1:
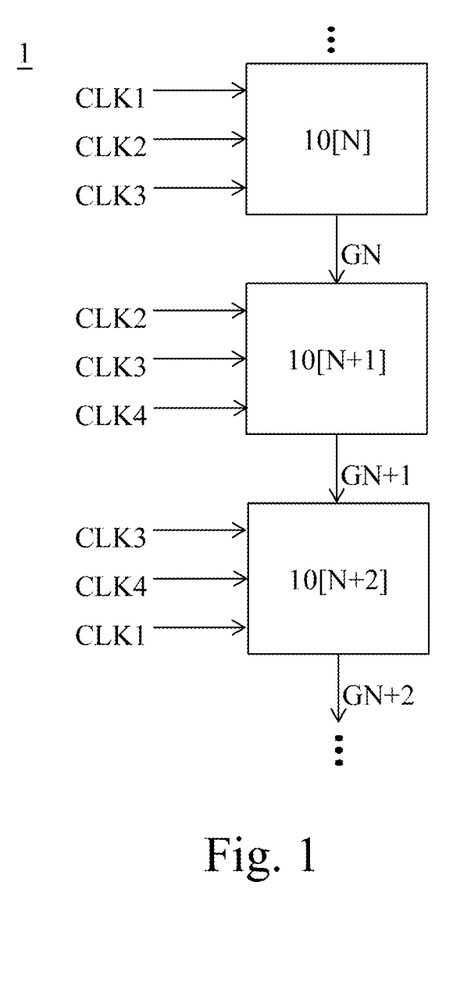
FIG. 1 illustrates a circuit diagram of a gate driving device according to some embodiments of the present invention.

FIG. 1 illustrates a circuit diagram of a gate driving device 1 according to some embodiments of the present invention. The gate driving device 1 includes a multi-stage of gate driving circuit. The said multi-stage of gate driving circuit is composed of plural gate driving circuits for respectively generating plural gate driving signals. For example, Nth-stage of gate driving circuit 10[N] is used for generating Nth-stage of gate driving signal GN, (N+1)th-stage of gate driving circuit 10[N+1] is used for generating (N+1)th-stage of gate driving signal GN+1, (N+2)th-stage of gate driving circuit 10[N+2] is used for generating (N+2)th-stage of gate driving signal GN+2, and so on. It is noted that the number of the gate driving circuits as shown in FIG. 1 is merely one example of the present invention, and the present invention is not limited thereto. N is a positive integer greater than 1.

Figure 2:
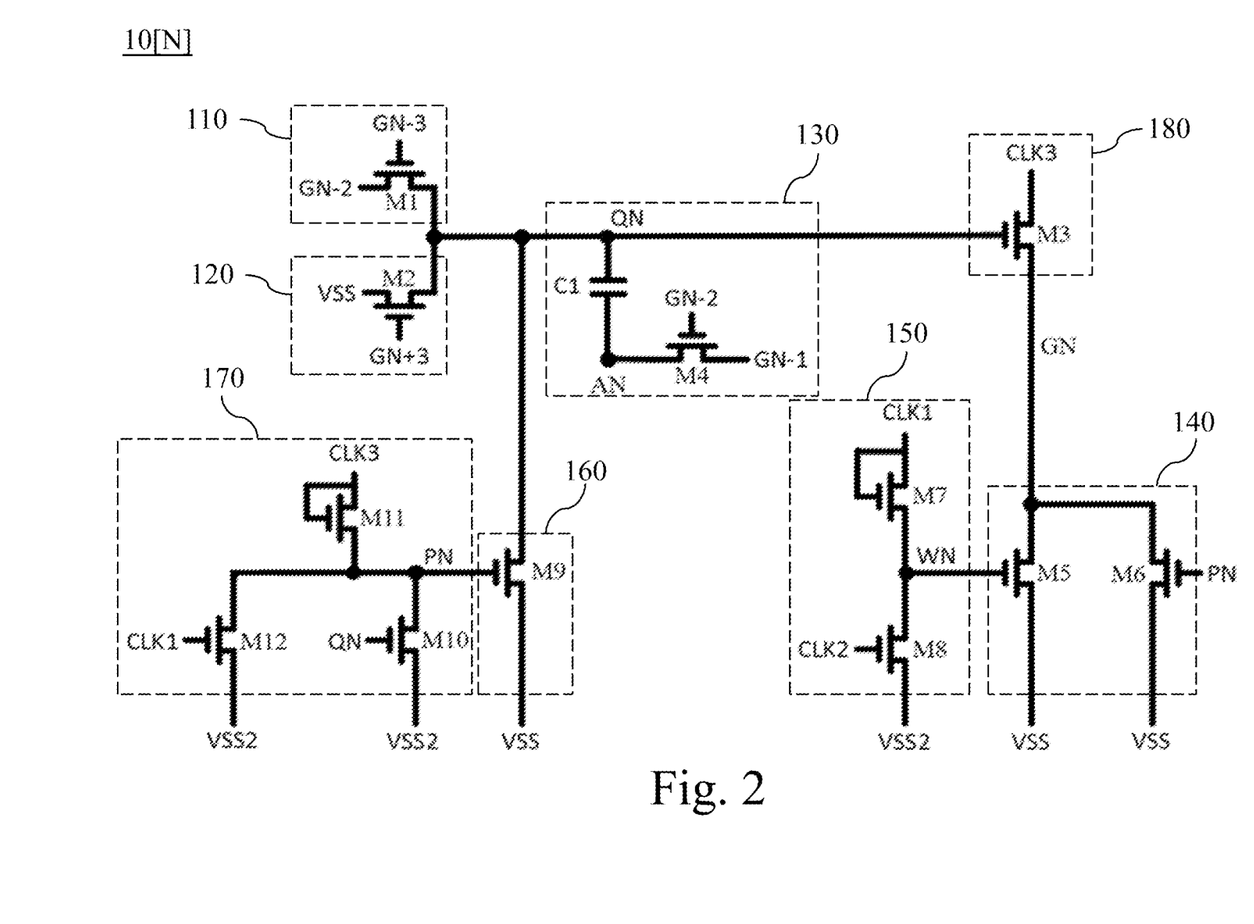
FIG. 2 illustrates a circuit diagram of an Nth-stage of gate driving circuit according to some embodiments of the present invention.

FIG. 2 illustrates a circuit diagram of the Nth-stage of gate driving circuit 10[N] according to some embodiments of the present invention. The Nth-stage of gate driving circuit 10[N] includes a pre-charge circuit 110, a bootstrapping circuit 130, and an output control circuit 180. The Nth-stage of gate driving circuit 10[N] further includes a discharge circuit 120, a first anti-noise circuit 140, a first negative bias compensation circuit 150, a second anti-noise circuit 160, and a second negative bias compensation circuit 170.

The pre-charge circuit 110 includes a first transistor M1. The first transistor M1 has a first terminal, a second terminal and a control terminal. The discharge circuit 120 includes a second transistor M2. The second transistor M2 has a first terminal, a second terminal and a control terminal. The output control circuit 180 includes a third transistor M3. The third transistor M3 has a first terminal, a second terminal and a control terminal. The bootstrapping circuit 130 is composed of a bootstrapping capacitor C1 and a fourth transistor M4. The fourth transistor M4 has a first terminal, a second terminal and a control terminal.

With regard to the bootstrapping circuit 130, a first terminal of the bootstrapping capacitor C1 is connected to a node QN, and a second terminal of the bootstrapping capacitor C1 is connected to the first terminal of the fourth transistor M4 through a node AN, and the control terminal of the fourth transistor M4 receives (N−2)th-stage of gate driving signal GN−2, and the second terminal of the fourth transistor M4 receives (N−1)th-stage of gate driving signal GN−1.

With regard to the pre-charge circuit 110, the first terminal of the first transistor M1 is connected to the first terminal of the bootstrapping capacitor C1 through the node QN (i.e., the pre-charge circuit 110 is connected to the bootstrapping circuit 130), and the control terminal of the first transistor M1 receives (N−3)th-stage of gate driving signal GN−3, and the second terminal of the first transistor M1 receives the (N−2)th-stage of gate driving signal GN−2.

With regard to the output control circuit 180, the first terminal of the third transistor M3 receives a first clock signal CLK3, and the control terminal of the third transistor M3 is connected to the first terminal of the bootstrapping capacitor C1 and the first terminal of the first transistor M1 through the node QN (i.e., the output control circuit 180 is connected to the pre-charge circuit 110 and the bootstrapping circuit 130). The third transistor M3 generates the Nth-stage of gate driving signal GN at the second terminal of the third transistor M3 according to the first clock signal CLK3 received by the first terminal of the third transistor M3 and a voltage signal at the node QN connected to the control terminal of the third transistor M3. Specifically, the output control circuit 180 of the Nth-stage of gate driving circuit 10[N] outputs the Nth-stage of gate driving signal GN through the second terminal of the third transistor M3.

With regard to the discharge circuit 120, the first terminal of the second transistor M2 is connected to the first terminal of the first transistor M1, the first terminal of the bootstrapping capacitor C1, and the control terminal of the third transistor M3 through the node QN (i.e., the discharge circuit 120 is connected to the pre-charge circuit 110, the bootstrapping circuit 130 and the output control circuit 180), and the control terminal of the second transistor M2 receives (N+3)th-stage of gate driving signal GN+3, and the second terminal of the second transistor M2 receives a first low system voltage VSS.

The first anti-noise circuit 140 includes a fifth transistor M5 and a sixth transistor M6. The fifth transistor M5 has a first terminal, a second terminal and a control terminal. The sixth transistor M6 has a first terminal, a second terminal and a control terminal. The first terminal of the fifth transistor M5 and the first terminal of the sixth transistor M6 are connected to the second terminal of the third transistor M3 (i.e., the first anti-noise circuit 140 is connected to the output control circuit 180). The control terminal of the fifth transistor M5 is connected to a node WN. The control terminal of the sixth transistor M6 is connected to a node PN. The second terminal of the fifth transistor M5 and the second terminal of the sixth transistor M6 receive the first low system voltage VSS.

The first negative bias compensation circuit 150 includes a seventh transistor M7 and an eighth transistor M8. The seventh transistor M7 has a first terminal, a second terminal and a control terminal. The eighth transistor M8 has a first terminal, a second terminal and a control terminal. The first terminal and the control terminal of the seventh transistor M7 receive a second clock signal CLK1. The second terminal of the seventh transistor M7 is connected to the first terminal of the eighth transistor M8. The second terminal of the seventh transistor M7 and the first terminal of the eighth transistor M8 are connected to the control terminal of the fifth transistor M5 through the node WN (i.e., the first negative bias compensation circuit 150 is connected to the first anti-noise circuit 140). The control terminal of the eighth transistor M8 receives a third clock signal CLK2. The second terminal of the eighth transistor M8 receives a second low system voltage VSS2.

In some embodiments of the present invention, the second low system voltage VSS2 is less than the first low system voltage VSS. For example, the second low system voltage VSS2 is −10 volt (V), and the first low system voltage VSS is −6V, and a high voltage level VDD is 18V, but the present invention is not limited thereto.

The second anti-noise circuit 160 includes a ninth transistor M9. The ninth transistor M9 has a first terminal, a second terminal and a control terminal. The first terminal of the ninth transistor M9 is connected to the first terminal of the first transistor M1, the first terminal of the second transistor M2, the first terminal of the bootstrapping capacitor C1, and the control terminal of the third transistor M3 through the node QN (i.e., the second anti-noise circuit 160 is connected to the pre-charge circuit 110, the discharge circuit 120, the bootstrapping circuit 130, and an output control circuit 180). The second terminal of the ninth transistor M9 receives the first low system voltage VSS. The control terminal of the ninth transistor M9 is connected to the node PN.

The second negative bias compensation circuit 170 includes a tenth transistor M10, an eleventh transistor M11 and a twelfth transistor M12. The tenth transistor M10 has a first terminal, a second terminal and a control terminal. The eleventh transistor M11 has a first terminal, a second terminal and a control terminal. The twelfth transistor M12 has a first terminal, a second terminal and a control terminal. The first terminal and the control terminal of the eleventh transistor M11 receive the first clock signal CLK3. The first terminal of the tenth transistor M10 is connected to the second terminal of the eleventh transistor M11 and the first terminal of the twelfth transistor M12. The first terminal of the tenth transistor M10, the second terminal of the eleventh transistor M11 and the first terminal of the twelfth transistor M12 are connected to the control terminal of the ninth transistor M9 through the node PN (i.e., the second negative bias compensation circuit 170 is connected to the second anti-noise circuit 160). The control terminal of the tenth transistor M10 is connected to the node QN. The control terminal of the twelfth transistor M12 receives the second clock signal CLK1. The second terminal of the tenth transistor M10 and the second terminal of the twelfth transistor M12 receive the second low system voltage VSS2.

Figure 3:
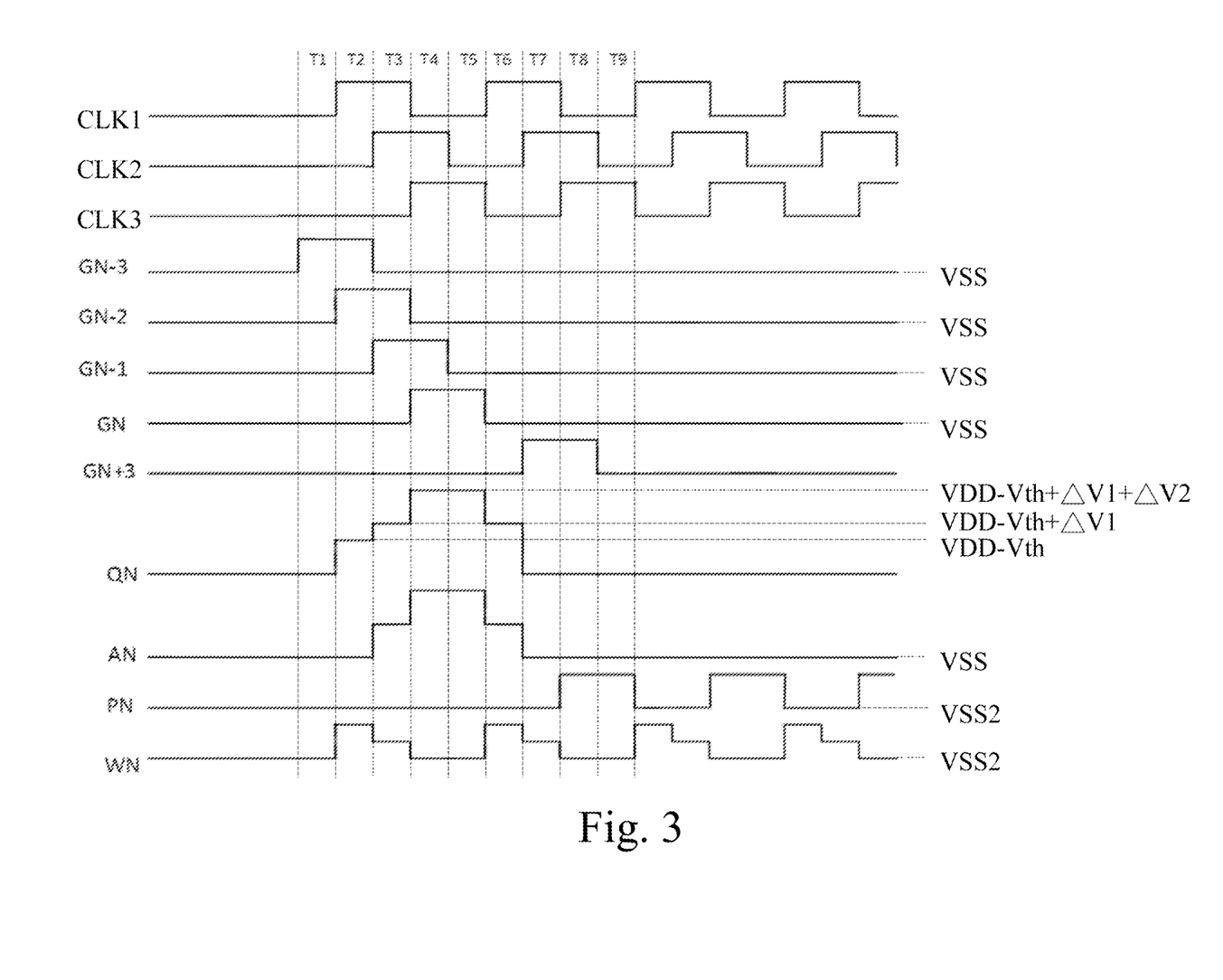
FIG. 3 illustrates a timing chart of the Nth-stage of gate driving circuit according to some embodiments of the present invention.

The aforementioned content has described the detailed component connection relationship of the Nth-stage of gate driving circuit 10[N]. The following content will explain the operation of the circuits of the present invention such that the improvement of driving capability could be achieved. FIG. 3 illustrates a timing chart of the Nth-stage of gate driving circuit 10[N] according to some embodiments of the present invention. Referring to FIG. 2 and FIG. 3.

First, during the first duration T1, the control terminal of the first transistor M1 of the pre-charge circuit 110 receives the (N−3)th-stage of gate driving signal GN−3 with a high voltage level VDD so as to turn on the first transistor M1, such that the node QN connected to the first terminal of the first transistor M1 is pulled down to a first voltage. The said first voltage is identical to the present voltage level (i.e., the first low system voltage VSS) of the (N−2)th-stage of gate driving signal GN−2 received by the second terminal of the first transistor M1.

Then, during the second duration T2, the control terminal of the first transistor M1 of the pre-charge circuit 110 receives the (N−3)th-stage of gate driving signal GN−3 with the high voltage level VDD so as to continuously turn on the first transistor M1, meanwhile, the (N−2)th-stage of gate driving signal GN−2 received by the second terminal of the first transistor M1 is pulled up from the first low system voltage VSS to the high voltage level VDD, such that a first-stage voltage rise occurs at the node QN connected to the first terminal of the first transistor M1. Specifically, the node QN is boosted from the first voltage to a second voltage. The said second voltage is identical to the high voltage level VDD minus a threshold voltage Vth of the first transistor M1, i.e., VDD-Vth. The said second voltage of the node QN connected to the control terminal of the third transistor M3 also causes the third transistor M3 of the output control circuit 180 to be turned on.

On the other hand, the (N−2)th-stage of gate driving signal GN−2 received by the control terminal of the fourth transistor M4 of the bootstrapping circuit 130 is pulled up from the first low system voltage VSS to the high voltage level VDD so as to turn on the fourth transistor M4, such that the voltage level of the node AN connected to the first terminal of the fourth transistor M4 is identical to the present voltage level (i.e., the first low system voltage VSS) of the (N−1)th-stage of gate driving signal GN−1 received by the second terminal of the fourth transistor M4. Therefore, the voltage difference between the node QN and the node AN causes the bootstrapping capacitor C1 has a capacitive potential (i.e., VDD-Vth-VSS) for the generation of the subsequent capacitive coupling operation.

In addition, in the meantime, the ninth transistor M9 of the second anti-noise circuit 160 is turned off, and the tenth transistor M10, the eleventh transistor M11 and the twelfth transistor M12 of the second negative bias compensation circuit 170 are turned on, and therefore the control terminal of the ninth transistor M9 is pulled down to the second low system voltage VSS2 received by the second terminal of the tenth transistor M10 and the second terminal of the twelfth transistor M12, such that a gate-to-source voltage (Vgs) of the ninth transistor M9 is identical to the second low system voltage VSS2 minus the first low system voltage VSS (e.g., (−10V)−(−6V)=(−4V)). Thus, the lower cross-voltage Vgs of the turned off ninth transistor M9 causes the ninth transistor M9 to be operated in the lower current leakage state. And therefore, during the second duration T2, the current leakage of the ninth transistor M9 could be avoided and the voltage level of the node QN connected to the first terminal of the ninth transistor M9 could be maintained at the second voltage.

In addition, in the meantime, the fifth transistor M5, the seventh transistor M7 and the eighth transistor M8 are turned on, such that the Nth-stage of gate driving signal GN received by the first terminal of the fifth transistor M5 is pulled down to the first low system voltage VSS received by the second terminal of the fifth transistor M5, thereby preventing noise generation.

Then, during the third duration T3, the (N−3)th-stage of gate driving signal GN−3 received by the control terminal of the first transistor M1 of the pre-charge circuit 110 is pulled down from the high voltage level VDD to the first low system voltage VSS so as to turn off the first transistor M1, meanwhile, the control terminal of the fourth transistor M4 of the bootstrapping circuit 130 receives the (N−2)th-stage of gate driving signal GN−2 with the high voltage level VDD so as to continuously turn on the fourth transistor M4. In the meantime, the (N−1)th-stage of gate driving signal GN−1 received by the second terminal of the fourth transistor M4 is pulled up from the first low system voltage VSS to the high voltage level VDD so as to charge the node AN connected to the first terminal of the fourth transistor M4, such that a voltage rise occurs at the node AN. Thus, a second-stage voltage rise occurs at the node QN by utilizing the capacitive coupling of the bootstrapping capacitor C1. Specifically, the node QN is boosted from the second voltage to a third voltage (i.e., VDD−Vth+ΔV1).

In addition, in the meantime, the ninth transistor M9 of the second anti-noise circuit 160 is turned off, and the tenth transistor M10, the eleventh transistor M11 and the twelfth transistor M12 of the second negative bias compensation circuit 170 are turned on, and therefore the gate-to-source voltage (Vgs) of the ninth transistor M9 is still identical to the second low system voltage VSS2 minus the first low system voltage VSS. Thus, the lower cross-voltage Vgs of the turned off ninth transistor M9 causes the ninth transistor M9 to be still operated in the lower current leakage state. And therefore, during the third duration T3, the current leakage of the ninth transistor M9 could be avoided and the voltage level of the node QN connected to the first terminal of the ninth transistor M9 could be maintained at the third voltage.

In addition, in the meantime, the fifth transistor M5, the seventh transistor M7 and the eighth transistor M8 are turned on, such that the Nth-stage of gate driving signal GN received by the first terminal of the fifth transistor M5 is pulled down to the first low system voltage VSS received by the second terminal of the fifth transistor M5, thereby preventing noise generation.

Then, during the fourth duration T4 and the fifth duration T5, the (N−2)th-stage of gate driving signal GN−2 received by the control terminal of the fourth transistor M4 of the bootstrapping circuit 130 is pulled down from the high voltage level VDD to the first low system voltage VSS so as to turn off the fourth transistor M4, meanwhile, the first clock signal CLK3 received by the first terminal of the third transistor M3 of the output control circuit 180 is pulled up from the first low system voltage VSS to the high voltage level VDD. Thus, a third-stage voltage rise occurs at the node QN connected to the control terminal of the third transistor M3 by utilizing the capacitive coupling of the parasitic capacitor (e.g., a gate-to-drain capacitor Cgd) of the third transistor M3. Specifically, the node QN is boosted from the third voltage to a fourth voltage (i.e., VDD−Vth+ΔV1+ΔV2).

On the other hand, in the meantime, by utilizing the capacitive coupling of the parasitic capacitor (e.g., a gate-to-source capacitor Cgs) of the third transistor M3, the Nth-stage of gate driving signal GN outputted by the second terminal of the third transistor M3 is pulled up to a voltage level which is approximately identical to the voltage level of the node QN connected to the control terminal of the third transistor M3. In other words, during the fourth duration T4 and the fifth duration T5, the output control circuit 180 pull up the Nth-stage of gate driving signal GN outputted by the second terminal of the third transistor M3 according to the fourth voltage of the first terminal of the bootstrapping capacitor C1 and the first clock signal CLK3.

It is noted that when the operation reaches the fourth duration T4 and the fifth duration T5, the voltage level of the node QN is highest. As shown in the timing chart of FIG. 3, under the operational mode, the first terminal of the bootstrapping capacitor C1 is pulled up to the second voltage VDD-Vth during the second duration T2, and then the first terminal of the bootstrapping capacitor C1 is pulled up from the second voltage VDD-Vth to the third voltage VDD−Vth+ΔV1 during the third duration T3, and then the first terminal of the bootstrapping capacitor C1 is pulled up from the third voltage VDD−Vth+ΔV1 to the fourth voltage VDD−Vth+ΔV1+ΔV2 during the fourth duration T4 and the fifth duration T5. The multiple stages of voltage rise are respectively occurred at the first terminal of the bootstrapping capacitor C1 during the different durations. By the means of charging and then capacitive coupling, the node QN of the Nth-stage of gate driving circuit 10[N] could be pulled up to a higher voltage level, such that the voltage level of the Nth-stage of gate driving signal GN of the Nth-stage of gate driving circuit 10[N] is also pulled up to another higher voltage level, thereby greatly improving the current driving capability of the Nth-stage of gate driving circuit 10[N].

In addition, because the multiple stages of voltage rise are respectively occurred at the first terminal of the bootstrapping capacitor C1 during the different durations, the node QN of the Nth-stage of gate driving circuit 10[N] could be quickly pulled up to a specified voltage level even in a low temperature environment (e.g., −40° C.), thereby solving the problem of greatly reduced current driving capability caused by the low carrier mobility of a-Si at the low temperature, such that the circuit of the present invention is more suitable for the display devices with high-speed requirements. In addition, because the multiple stages of voltage rise are respectively occurred at the first terminal of the bootstrapping capacitor C1 during the different durations, the electrical degradation of the circuit caused by high temperature environment (e.g., 85° C. or 90° C.) could be compensated, and thus the circuit of the present invention can be more reliable in extreme temperature environments and can pass the stress test at the high temperature environment (e.g., 85° C.).

It is noted that the bootstrapping capacitor C1 of the present invention is merely connected to five transistors (i.e., the first transistor M1, the second transistor M2, the third transistor M3, the fourth transistor M4 and the ninth transistor M9), and thus the voltage coupling efficiency of the bootstrapping capacitor C1 could be greatly improved. On the other hand, the design of the Nth-stage of gate driving circuit 10[N] of the present invention is more simplified. Specifically, by reducing the number of the components of the Nth-stage of gate driving circuit 10[N] of the present invention, the layout area could be saved and the production costs could be reduce, such that the present invention could meet the requirement of the medium-size GOA circuit and the Nth-stage of gate driving circuit 10[N] of the present invention could be more suitable for the display devices with high resolution and/or narrow bezels, such as the fingerprint recognition display devices, the pixel array display devices, the organic light-emitting diode (OLED) display devices, the micro-LED displays devices, the mini-LED display devices, etc.

In addition, during the fourth duration T4 and the fifth duration T5, the ninth transistor M9 of the second anti-noise circuit 160 is turned off, and the tenth transistor M10, the eleventh transistor M11 and the twelfth transistor M12 of the second negative bias compensation circuit 170 are turned on, and therefore the gate-to-source voltage (Vgs) of the ninth transistor M9 is still identical to the second low system voltage VSS2 minus the first low system voltage VSS. Thus, the lower cross-voltage Vgs of the turned off ninth transistor M9 causes the ninth transistor M9 to be still operated in the lower current leakage state. And therefore, during the fourth duration T4 and the fifth duration T5, the current leakage of the ninth transistor M9 could be avoided and the voltage level of the node QN connected to the first terminal of the ninth transistor M9 could be maintained at the fourth voltage.

In addition, in the meantime, the fifth transistor M5 of the first anti-noise circuit 140 is turned off, and the seventh transistor M7 and the eighth transistor M8 of the first negative bias compensation circuit 150 are turned on, and therefore the control terminal of the fifth transistor M5 is pulled down to the second low system voltage VSS2 received by the second terminal of the eighth transistor M8, such that the gate-to-source voltage (Vgs) of the fifth transistor M5 is identical to the second low system voltage VSS2 minus the first low system voltage VSS (e.g., (−10V)−(−6V)=(−4V)). Thus, the lower cross-voltage Vgs of the turned off fifth transistor M5 causes the fifth transistor M5 to be operated in the lower current leakage state. And therefore, during the fourth duration T4 and the fifth duration T5, the current leakage of the fifth transistor M5 could be avoided and the voltage level of the Nth-stage of gate driving signal GN received by the first terminal of the fifth transistor M5 could be maintained at the fourth voltage.

In addition, in the meantime, the sixth transistor M6 of the first anti-noise circuit 140 is turned off, and the node PN connected to the control terminal of the sixth transistor M6 is pulled down to the second low system voltage VSS2 received by the second terminal of the tenth transistor M10 and the second terminal of the twelfth transistor M12, such that the gate-to-source voltage (Vgs) of the sixth transistor M6 is identical to the second low system voltage VSS2 minus the first low system voltage VSS (e.g., (−10V)−(−6V)=(−4V)). Thus, the lower cross-voltage Vgs of the turned off sixth transistor M6 causes the sixth transistor M6 to be operated in the lower current leakage state. And therefore, during the fourth duration T4 and the fifth duration T5, the current leakage of the sixth transistor M6 could be avoided and the voltage level of the Nth-stage of gate driving signal GN received by the first terminal of the sixth transistor M6 could be maintained at the fourth voltage.

Specifically, under the operational mode (i.e., during the second duration T2 to the fifth duration T5) of the Nth-stage of gate driving circuit 10[N], the first anti-noise circuit 140, the first negative bias compensation circuit 150, the second anti-noise circuit 160 and/or the second negative bias compensation circuit 170 cause the current leakage could be avoided and the voltage level of the node QN and/or the voltage level of the Nth-stage of gate driving signal GN could be maintained. In addition, the lower cross-voltage Vgs of the turned off ninth transistor M9 could extend the life of the gate driving circuit at the high temperature environment. Therefore, the circuit of the present invention can be more reliable in extreme temperature environments and can pass the stress test at the high temperature environment.

Then, during the sixth duration T6, the first clock signal CLK3 received by the first terminal of the third transistor M3 of the output control circuit 180 is pulled down from the high voltage level VDD to the first low system voltage VSS. Thus, the node QN connected to the control terminal of the third transistor M3 is pulled down to the third voltage (i.e., VDD−Vth+ΔV1) by utilizing the capacitive coupling of the parasitic capacitor (e.g., a gate-to-drain capacitor Cgd) of the third transistor M3.

On the other hand, the first clock signal CLK3 is pulled down from the high voltage level VDD to the first low system voltage VSS, such that the Nth-stage of gate driving signal GN received by the second terminal of the turned on third transistor M3 is discharged. In the meantime, the second clock signal CLK1 is pulled up from the first low system voltage VSS to the high voltage level VDD, such that the node WN connected to the control terminal of the fifth transistor M5 is pulled up so as to turn on the fifth transistor M5. Thus, the Nth-stage of gate driving signal GN received by the first terminal of the turned on fifth transistor M5 is discharged toward the first low system voltage VSS received by the second terminal of the fifth transistor M5, and therefore the Nth-stage of gate driving signal GN is pulled down to the first low system voltage VSS, thereby preventing noise generation under the sleep mode (i.e., the sixth duration T6).

In addition, in the meantime, the sixth transistor M6 of the first anti-noise circuit 140 is turned off, and the tenth transistor M10, the eleventh transistor M11 and the twelfth transistor M12 of the second negative bias compensation circuit 170 are turned on, and therefore the node PN connected to the control terminal of the sixth transistor M6 is pulled down to the second low system voltage VSS2 received by the second terminal of the tenth transistor M10 and the second terminal of the twelfth transistor M12, such that the gate-to-source voltage (Vgs) of the sixth transistor M6 is identical to the second low system voltage VSS2 minus the first low system voltage VSS (e.g., (−10V)−(−6V)=(−4V)).

Accordingly, the cross-voltage Vgs of the sixth transistor M6 causes the negative bias compensation to be occurred on the sixth transistor M6. The electrons trapped by the defects of the insulator layer of the sixth transistor M6 could be effectively eliminated through the negative bias compensation, such that the threshold voltage of the sixth transistor M6 could be restored to the un-degraded threshold voltage.

In addition, in the meantime, the ninth transistor M9 of the second anti-noise circuit 160 is turned off, and the tenth transistor M10, the eleventh transistor M11 and the twelfth transistor M12 of the second negative bias compensation circuit 170 are turned on, and therefore the control terminal of the ninth transistor M9 is pulled down to the second low system voltage VSS2 received by the second terminal of the tenth transistor M10 and the second terminal of the twelfth transistor M12, such that the gate-to-source voltage (Vgs) of the ninth transistor M9 is identical to the second low system voltage VSS2 minus the first low system voltage VSS (e.g., (−10V)−(−6V)=(−4V)). Accordingly, the cross-voltage Vgs of the ninth transistor M9 causes the negative bias compensation to be occurred on the ninth transistor M9. The electrons trapped by the defects of the insulator layer of the ninth transistor M9 could be effectively eliminated through the negative bias compensation, such that the threshold voltage of the ninth transistor M9 could be restored to the un-degraded threshold voltage.

Then, during the seventh duration T7, the control terminal of the second transistor M2 of the discharge circuit 120 receives the (N+3)th-stage of gate driving signal GN+3 with the high voltage level VDD so as to turn on the second transistor M2, such that the node QN connected to the first terminal of the turned on second transistor M2 is discharged and pulled down to the first low system voltage VSS received by the second terminal of the second transistor M2, and the first low system voltage VSS of the node QN connected to the control terminal of the third transistor M3 further causes the third transistor M3 to be turned off.

In addition, in the meantime, the fifth transistor M5 is continuously turned on, such that the Nth-stage of gate driving signal GN received by the first terminal of the turned on fifth transistor M5 maintain at the first low system voltage VSS received by the second terminal of the fifth transistor M5, thereby preventing noise generation under the sleep mode (i.e., the seventh duration T7).

In addition, in the meantime, the sixth transistor M6 of the first anti-noise circuit 140 is turned off, and the tenth transistor M10, the eleventh transistor M11 and the twelfth transistor M12 of the second negative bias compensation circuit 170 are turned on, and therefore the node PN connected to the control terminal of the sixth transistor M6 is pulled down to the second low system voltage VSS2 received by the second terminal of the tenth transistor M10 and the second terminal of the twelfth transistor M12, such that the gate-to-source voltage (Vgs) of the sixth transistor M6 is identical to the second low system voltage VSS2 minus the first low system voltage VSS (e.g., (−10V)−(−6V)=(−4V)). Accordingly, the cross-voltage Vgs of the sixth transistor M6 causes the negative bias compensation to be occurred on the sixth transistor M6. The electrons trapped by the defects of the insulator layer of the sixth transistor M6 could be effectively eliminated through the negative bias compensation, such that the threshold voltage of the sixth transistor M6 could be restored to the un-degraded threshold voltage.

In addition, in the meantime, the ninth transistor M9 of the second anti-noise circuit 160 is turned off, and the tenth transistor M10, the eleventh transistor M11 and the twelfth transistor M12 of the second negative bias compensation circuit 170 are turned on, and therefore the control terminal of the ninth transistor M9 is pulled down to the second low system voltage VSS2 received by the second terminal of the tenth transistor M10 and the second terminal of the twelfth transistor M12, such that the gate-to-source voltage (Vgs) of the ninth transistor M9 is identical to the second low system voltage VSS2 minus the first low system voltage VSS (e.g., (−10V)−(−6V)=(−4V)). Accordingly, the cross-voltage Vgs of the ninth transistor M9 causes the negative bias compensation to be occurred on the ninth transistor M9. The electrons trapped by the defects of the insulator layer of the ninth transistor M9 could be effectively eliminated through the negative bias compensation, such that the threshold voltage of the ninth transistor M9 could be restored to the un-degraded threshold voltage.

Specifically, under the sleep mode (i.e., during the sixth duration T6 and the seventh duration T7) of the Nth-stage of gate driving circuit 10[N], the lower cross-voltage Vgs of the turned off ninth transistor M9 could extend the life of the gate driving circuit at the high temperature environment. Therefore, the circuit of the present invention can be more reliable in extreme temperature environments and can pass the stress test at the high temperature environment.

Then, during the eighth duration T8 and the ninth duration T9, the first clock signal CLK3 received by the first terminal and the control terminal of the tenth transistor M10 is pulled up from the first low system voltage VSS to the high voltage level VDD, such that the node PN connected to the second terminal of the turned on eleventh transistor M11 is pulled up to a voltage level that is identical to the high voltage level VDD minus the threshold voltage of the eleventh transistor M11.

Accordingly, the higher voltage level of the node PN causes the ninth transistor M9 of the second anti-noise circuit 160 to be turned on, and the turned on ninth transistor M9 causes the node QN connected to the first terminal of the ninth transistor M9 to be maintained at the first low system voltage VSS received by the second terminal of the ninth transistor M9, thereby preventing noise generation under the sleep mode (i.e., the eighth duration T8 and the ninth duration T9). In the meantime, the higher voltage level of the node PN causes the sixth transistor M6 of the first anti-noise circuit 140 to be turned on, and the turned on sixth transistor M6 causes the Nth-stage of gate driving signal GN received by the first terminal of the sixth transistor M6 to be maintained at the first low system voltage VSS received by the second terminal of the sixth transistor M6, thereby preventing noise generation under the sleep mode (i.e., the eighth duration T8 and the ninth duration T9).

In addition, in the meantime, the fifth transistor M5 of the first anti-noise circuit 140 is turned off, and the seventh transistor M7 and the eighth transistor M8 of the first negative bias compensation circuit 150 are turned on, and therefore the control terminal of the fifth transistor M5 is pulled down to the second low system voltage VSS2 received by the second terminal of the eighth transistor M8, such that the gate-to-source voltage (Vgs) of the fifth transistor M5 is identical to the second low system voltage VSS2 minus the first low system voltage VSS (e.g., (−10V)−(−6V)=(−4V)). Accordingly, the cross-voltage Vgs of the fifth transistor M5 causes the negative bias compensation to be occurred on the fifth transistor M5. The electrons trapped by the defects of the insulator layer of the fifth transistor M5 could be effectively eliminated through the negative bias compensation, such that the threshold voltage of the fifth transistor M5 could be restored to the un-degraded threshold voltage.

After the ninth duration T9, under the sleep mode, the operation will be repeated the cycle from the sixth duration T6 to the ninth duration T9. Until the next updated cycle (of the operational mode) arrives, the operation will start from the first duration T1.

Specifically, under the sleep mode (i.e., from the sixth duration T6 to the ninth duration T9) of the Nth-stage of gate driving circuit 10[N], the first anti-noise circuit 140 and/or the second anti-noise circuit 160 cause the voltage level of the node QN and/or the voltage level of the Nth-stage of gate driving signal GN to be maintained at the first low system voltage VSS, thereby preventing noise generation under the sleep mode. Accordingly, a full time anti-noise display device could be realized, such that the requirement of low noise output of the gate driving circuit of the display device with narrow bezel could be met.

Further, under the sleep mode (i.e., from the sixth duration T6 to the ninth duration T9) of the Nth-stage of gate driving circuit 10[N], by utilizing the negative bias compensation mechanism of the first negative bias compensation circuit 150 and/or the second negative bias compensation circuit 170, the threshold voltage(s) of the transistor(s) could be restored to the un-degraded threshold voltage(s), thereby improving the degradation of the transistor(s). Accordingly, regarding the problem that the positive shift of the threshold voltage of the transistor due to the long-term positive bias operation, the present invention utilizes the first negative bias compensation circuit 150 and the second negative bias compensation circuit 170 to compensate the threshold voltage(s) of the long-term operated transistor(s) so as to restore the threshold voltage(s), thereby improving the degradation of the transistor(s) and extending the life of the gate driving circuit.

Figure 4:
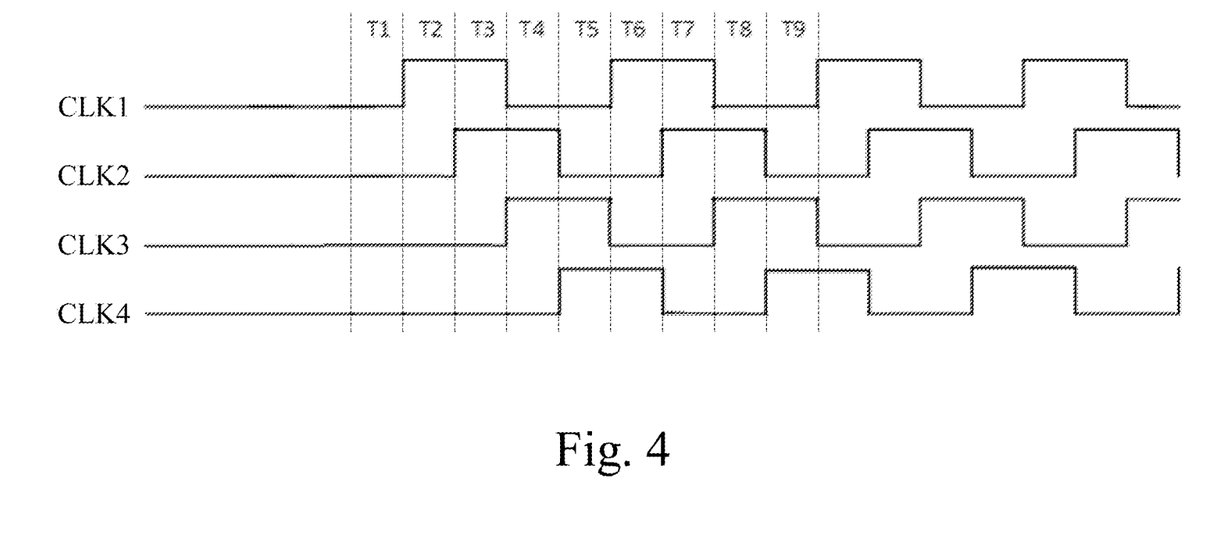
FIG. 4 illustrates a timing chart of plural clock signals according to some embodiments of the present invention.

It is worth mentioning that, referring to the timing chart of the Nth-stage of gate driving circuit 10[N] as shown in FIG. 3, the Nth-stage of gate driving circuit 10[N] receives the clock signals CLK1, CLK2, and CLK3. As shown in FIG. 1, the (N+1)th-stage of gate driving circuit 10[N+1] receives the clock signals CLK2, CLK3, and CLK4, and the (N+2)th-stage of gate driving circuit 10[N+2] receives the clock signals CLK3, CLK4, and CLK1, and the (N+3)th-stage of gate driving circuit 10[N+3] receives the clock signals CLK4, CLK1, and CLK2, and so on. FIG. 4 illustrates a timing chart of the clock signals CLK1, CLK2, CLK3, and CLK4 according to some embodiments of the present invention. As shown in FIG. 4, the time interval that the clock signal CLK1 is at the high voltage level partially overlaps with the time interval that the clock signal CLK2 is at the high voltage level, and the time interval that the clock signal CLK2 is at the high voltage level partially overlaps with the time interval that the clock signal CLK3 is at the high voltage level, and the time interval that the clock signal CLK3 is at the high voltage level partially overlaps with the time interval that the clock signal CLK4 is at the high voltage level.

In addition, it should be understood that the second terminal of the third transistor M3 of the (N+1)th-stage of gate driving circuit 10[N+1] is configured to output the (N+1)th-stage of gate driving signal GN+1, and the control terminal of the first transistor M1 and the second terminal of the second transistor M2 of the (N+1)th-stage of gate driving circuit 10[N+1] are configured to receive the (N−1)th-stage of gate driving signal GN−1, and the second terminal of the first transistor M1 of the (N+1)th-stage of gate driving circuit 10[N+1] is configured to receive the Nth-stage of gate driving signal GN, and the control terminal of the second transistor M2 of the (N+1)th-stage of gate driving circuit 10[N+1] is configured to receive the (N−2)th-stage of gate driving signal GN−2, and the control terminal of the fourth transistor M4 of the (N+1)th-stage of gate driving circuit 10[N+1] is configured to receive the (N+4)th-stage of gate driving signal GN+4, and so on.

It is worth mentioning that, as shown in FIG. 2, the Nth-stage of gate driving circuit 10[N] of the present invention merely has two DC voltage sources (i.e., the first low system voltage VSS and the second low system voltage VSS2), and the Nth-stage of gate driving circuit 10[N] of the present invention does not have the DC voltage source with the high voltage level VDD. Therefore, the gate driving device 1 of the present invention does not need to dispose the metal wire of the DC voltage source with the high voltage level VDD upon the edge of the circuit, such that the gate driving device 1 of the present invention is more suitable for the display devices with narrow bezels and more suitable for spliced displays.

Figure 5:
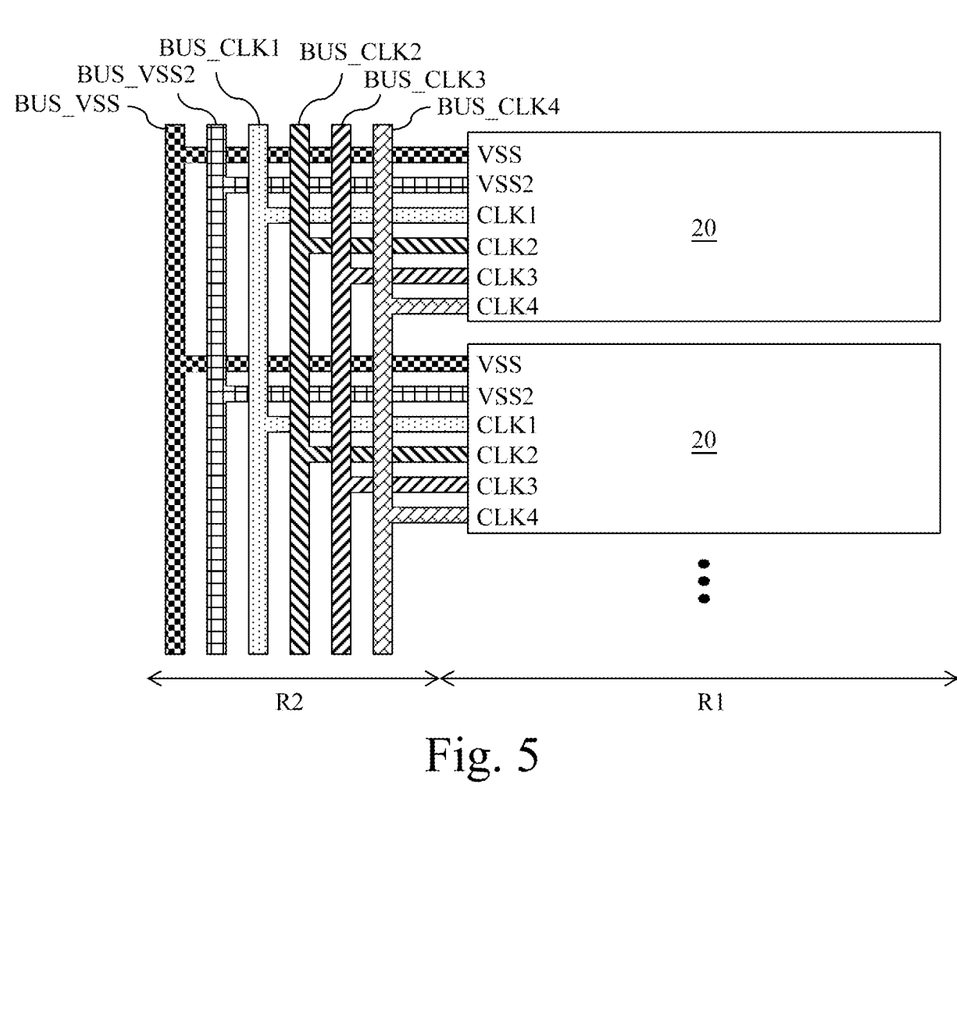
FIG. 5 illustrates a spliced display according to some embodiments of the present invention.
Figure 6:
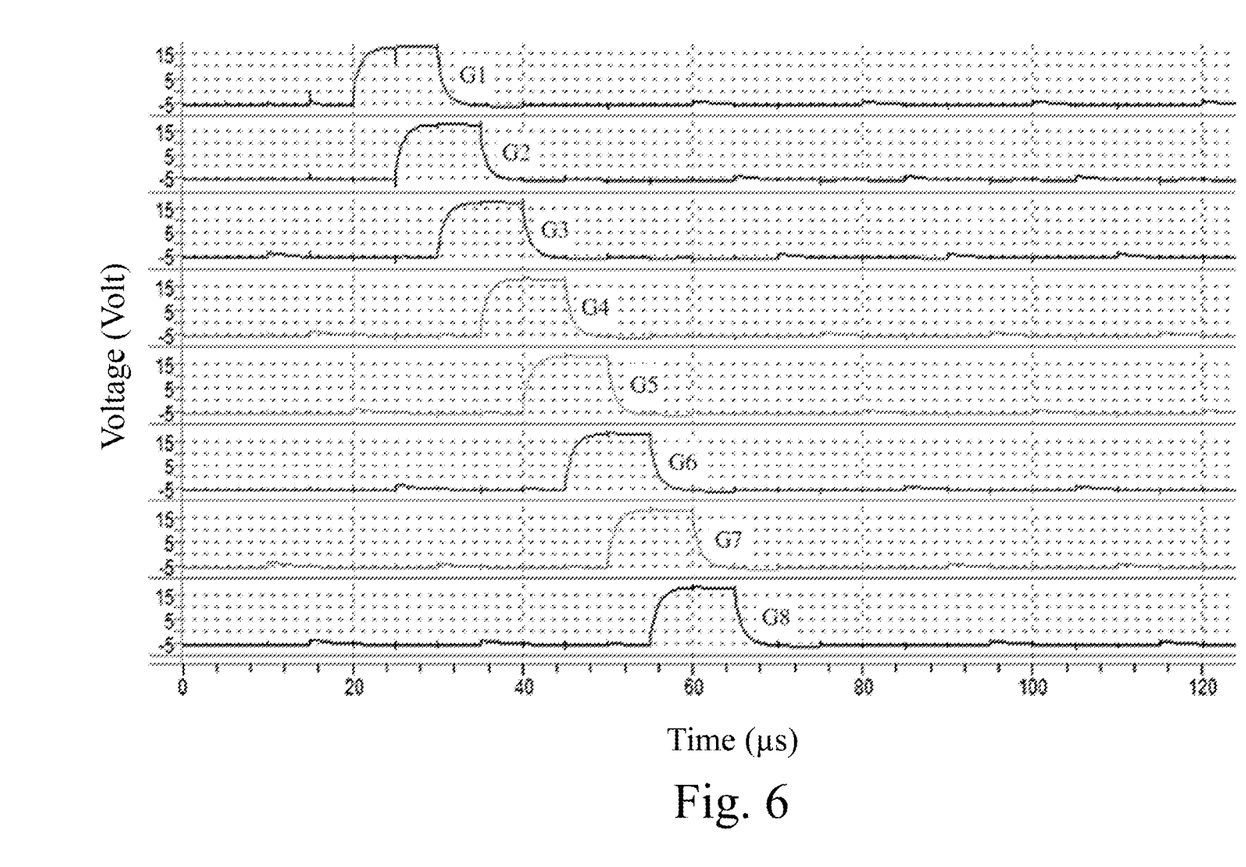
FIG. 6 illustrates a waveform diagram of a gate driving signal of a gate driving circuit at the at a high temperature environment according to some embodiments of the present invention.

FIG. 5 illustrates a spliced display according to some embodiments of the present invention. The spliced display includes plural display panels 20 disposed within a display region R1 of the spliced display. The display panels 20 are spliced to each other. Each of the display panels 20 has a gate driving device (not shown). The circuit diagram and the operations of the said gate driving device are the same as the circuit diagram and the operations of the aforementioned gate driving device 1 and are not repeated here to avoid duplicity. The said gate driving device includes a multi-stage of gate driving circuit composed of plural gate driving circuits (not shown). The circuit diagrams and the operations of the said gate driving circuits are the same as the circuit diagrams and the operations of the aforementioned gate driving circuits 10[N], 10[N+1], 10[N+2], etc., and are not repeated here to avoid duplicity. Two power buses disposed within the border region R2 of the spliced display are composed of a power bus BUS_VSS and a power bus BUS_VSS2. The power bus BUS_VSS is configured to supply the first low system voltage VSS to each of the display panels 20 of the multi-stage of gate driving circuit. The power bus BUS_VSS2 is configured to supply the second low system voltage VSS2 to each of the display panels 20 of the multi-stage of gate driving circuit. Plural signal buses disposed within the border region R2 of the spliced display include a clock bus BUS_CLK1, a clock bus BUS_CLK2, a clock bus BUS_CLK3 and a clock bus BUS_CLK4. The clock bus BUS_CLK1 is configured to supply the clock signal CLK1 to each of the display panels 20 of the multi-stage of gate driving circuit. The clock bus BUS_CLK2 is configured to supply the clock signal CLK2 to each of the display panels 20 of the multi-stage of gate driving circuit. The clock bus BUS_CLK3 is configured to supply the clock signal CLK3 to each of the display panels 20 of the multi-stage of gate driving circuit. The clock bus BUS_CLK4 is configured to supply the clock signal CLK4 to each of the display panels 20 of the multi-stage of gate driving circuit. As shown in FIG. 5, the spliced display of the present invention does not need to dispose a power bus for supplying the high voltage level VDD within the border region R2 of the spliced display, such that the bezels of the spliced display of the present invention become narrower, thereby providing the better visual experience. Referring to the following FIG. 6 and table 1. FIG. 6 illustrates a waveform diagram of the gate driving signal of the gate driving circuit at the at the high temperature environment (i.e., 85° C.) according to some embodiments of the present invention. In FIG. 6, the horizontal axis represents the time (μs) and the vertical axis represents the voltage value (volt). G1 represents the 1st-stage of gate driving signal outputted by the 1st-stage of gate driving circuit, and G2 represents the 2nd-stage of gate driving signal outputted by the 2nd-stage of gate driving circuit, and G3 represents the 3rd-stage of gate driving signal outputted by the 3rd-stage of gate driving circuit, and so on. Table 1 shows the measurement results of the gate driving circuit at the high temperature environment (i.e., 85° C.).

TABLE 1

|    | Noise (RMS) | Rising time (μs) | Falling time (μs) |
|----|-------------|------------------|-------------------|
| G1 | 0.16        | 2.05             | 1.83              |
| G2 | 0.16        | 2.04             | 1.89              |
| G3 | 0.16        | 2.04             | 1.89              |
| G4 | 0.16        | 2.06             | 1.91              |
| G5 | 0.16        | 2.04             | 1.89              |
| G6 | 0.16        | 2.05             | 1.89              |
| G7 | 0.16        | 2.05             | 1.9               |
| G8 | 0.16        | 2.02             | 1.94              |

The rising time as shown in table 1 is defined as the time required for the voltage signal to rise from 10% to 90% when the voltage signal is charged from −6V (the first low system voltage VSS) to 18V (the high voltage level VDD). The falling time as shown in table 1 is defined as the time required for the voltage signal to fall from 90% to 10% when the voltage signal is discharged from 18V (the high voltage level VDD) to −6V (the first low system voltage VSS). As shown in table 1, the gate driving circuit of the present invention has good rising time and good falling time (i.e., the fast rising time and the faster falling time), and the noise (RMS) is lower than 0.5. Further, the same kind of measurement values as shown in table 1 are slimier, and thus the driving voltage is stable, and the voltage level of the node QN could be presented as expected according to the designed circuit. Accordingly, the present invention realizes the multiple stages of voltage rise, thereby greatly improving the current driving capability.

In addition, as shown in FIG. 6 and table 1, the gate driving circuit of the present invention has a stable gate driving signal at the high temperature environment, thereby confirming that the gate driving circuit of the present invention can prevent current leakage and has anti-noise effect at the high temperature environment. Therefore, the circuit of the present invention can be more reliable in extreme temperature environments and can pass the stress test at the high temperature environment.

In addition, as shown in FIG. 6, the time intervals that the gate driving signals of the adjacent-stages of gate driving circuit (e.g., the 1st-stage of gate driving signal G1 outputted by the 1st-stage of gate driving circuit and the 2nd-stage of gate driving signal G2 outputted by the 2nd-stage of gate driving circuit) are at the high voltage level partially overlap with each other, thereby solving the problem of greatly reduced current driving capability caused by the low carrier mobility of a-Si at the low temperature. The aforementioned partially overlapping mechanism could provide the longer charging time, such that the gate driving signal could be charged to the specific voltage level, thereby solving the problem of insufficient charging at the low temperature environment. Accordingly, the circuit of the present invention can be more reliable in extreme temperature environments.

From the above description, the present invention provides a gate driving device. The multiple stages of voltage rise are respectively occurred at the bootstrapping capacitor C1 during the different durations, such that the node QN of the gate driving circuit could be pulled up to a higher voltage level, and the gate driving signal has good rising time and good falling time, thereby greatly improving the current driving capability. In addition, the gate driving circuit of the present invention has negative bias compensation mechanism to improve the degradation of the transistor(s), thereby extending the life of the circuit. Further, the gate driving circuit of the present invention has anti-noise mechanism to realize the full time anti-noise display device.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gate driving circuit, comprising:
a bootstrapping circuit composed of a bootstrapping capacitor and a transistor, wherein a first terminal of the bootstrapping capacitor has a first voltage during a first duration;
a pre-charge circuit connected to the first terminal of the bootstrapping capacitor, wherein the pre-charge circuit boosts the first terminal of the bootstrapping capacitor from the first voltage to a second voltage during a second duration, wherein the bootstrapping circuit boosts the first terminal of the bootstrapping capacitor from the second voltage to a third voltage during a third duration;
an output control circuit connected to the first terminal of the bootstrapping capacitor, wherein the output control circuit boosts the first terminal of the bootstrapping capacitor from the third voltage to a fourth voltage during a fourth duration, wherein the output control circuit includes a third transistor, wherein a control terminal of the third transistor is connected to the first terminal of the bootstrapping capacitor and a first terminal of the third transistor receives a first clock signal, such that the third transistor generates a gate driving signal at a second terminal of the third transistor; and
a first anti-noise circuit including a fifth transistor and a sixth transistor, wherein a first terminal of the fifth transistor and a first terminal of the sixth transistor are connected to the second terminal of the third transistor, wherein a second terminal of the fifth transistor and a second terminal of the sixth transistor receive a first low system voltage, wherein a control terminal of the fifth transistor is connected to a first node, wherein a control terminal of the sixth transistor is connected to a second node.

2. The gate driving circuit of claim 1, wherein the pre-charge circuit includes a first transistor, wherein a first terminal of the first transistor is connected to the first terminal of the bootstrapping capacitor.

3. The gate driving circuit of claim 2, wherein during the first duration, the first transistor is turned on such that the first terminal of the bootstrapping capacitor has the first voltage.

4. The gate driving circuit of claim 2, wherein during the second duration, the first transistor is turned on and a high voltage level is provided to a second terminal of the first transistor such that the first terminal of the bootstrapping capacitor is boosted from the first voltage to the second voltage.

5. The gate driving circuit of claim 1, further comprising:
a discharge circuit including a second transistor, wherein a first terminal of the second transistor is connected to the first terminal of the bootstrapping capacitor, wherein a second terminal of the second transistor receives the first low system voltage.

6. The gate driving circuit of claim 1, wherein the transistor of the bootstrapping circuit is a fourth transistor, wherein a second terminal of the bootstrapping capacitor is connected to a first terminal of the fourth transistor.

7. The gate driving circuit of claim 6, wherein during the third duration, a high voltage level is provided to a second terminal of the fourth transistor such that the first terminal of the bootstrapping capacitor is boosted from the second voltage to the third voltage.

8. The gate driving circuit of claim 1, further comprising:
a first negative bias compensation circuit including a seventh transistor and an eighth transistor, wherein a first terminal and a control terminal of the seventh transistor receive a second clock signal, wherein a second terminal of the seventh transistor and a first terminal of the eighth transistor are connected to the first node, wherein a control terminal of the eighth transistor receives a third clock signal, wherein a second terminal of the eighth transistor receives a second low system voltage.

9. The gate driving circuit of claim 8, wherein the second low system voltage is less than the first low system voltage.

10. The gate driving circuit of claim 8, further comprising:
a second anti-noise circuit including a ninth transistor, wherein a first terminal of the ninth transistor is connected to the first terminal of the bootstrapping capacitor, wherein a second terminal of the ninth transistor receives the first low system voltage, wherein a control terminal of the ninth transistor is connected to the second node.

11. The gate driving circuit of claim 10, wherein during the fourth duration and a fifth duration, the first terminal of the third transistor receives the first clock signal with a high voltage level such that the first terminal of the bootstrapping capacitor is boosted from the third voltage to the fourth voltage.

12. The gate driving circuit of claim 11, wherein during the fourth duration and the fifth duration, the ninth transistor is configured to maintain the fourth voltage that the first terminal of the bootstrapping capacitor has.

13. The gate driving circuit of claim 10, further comprising:
a second negative bias compensation circuit including a tenth transistor, an eleventh transistor and a twelfth transistor, wherein a first terminal and a control terminal of the eleventh transistor receive the first clock signal, wherein a first terminal of the tenth transistor, a second terminal of the eleventh transistor and a first terminal of the twelfth transistor are connected to the second node, wherein a second terminal of the tenth transistor and a second terminal of the twelfth transistor receive the second low system voltage, wherein a control terminal of the twelfth transistor receives the second clock signal.

14. The gate driving circuit of claim 13, wherein during a eighth duration and a ninth duration, the first terminal and the control terminal of the eleventh transistor receive the first clock signal with a high voltage level to turn on the ninth transistor such that the first terminal of the bootstrapping capacitor is pulled down to the first low system voltage so as to prevent noise generation, wherein during the eighth duration and the ninth duration, the fifth transistor is turned off such that the fifth transistor performs negative bias compensation.

15. The gate driving circuit of claim 10, wherein during a sixth duration, the first terminal of the third transistor receives the first clock signal with the first low system voltage such that the first terminal of the bootstrapping capacitor is pulled down from the fourth voltage to the third voltage.

16. The gate driving circuit of claim 15, wherein during a seventh duration, a control terminal of the second transistor is at a high voltage level to turn on the second transistor such that the first terminal of the bootstrapping capacitor is pulled down from the third voltage to the first voltage.

17. The gate driving circuit of claim 16, wherein during the sixth duration and the seventh duration, the ninth transistor is turned off such that the ninth transistor performs negative bias compensation.

18. A gate driving device, comprising:
a multi-stage of gate driving circuit composed of a plurality of gate driving circuits for respectively generating a plurality of gate driving signals, wherein Nth-stage of gate driving circuit comprises:
a bootstrapping circuit composed of a bootstrapping capacitor and a transistor, wherein a first terminal of the bootstrapping capacitor has a first voltage during a first duration;
a pre-charge circuit connected to the first terminal of the bootstrapping capacitor, wherein the pre-charge circuit boosts the first terminal of the bootstrapping capacitor from the first voltage to a second voltage during a second duration, wherein the bootstrapping circuit boosts the first terminal of the bootstrapping capacitor from the second voltage to a third voltage during a third duration;
an output control circuit connected to the first terminal of the bootstrapping capacitor, wherein the output control circuit boosts the first terminal of the bootstrapping capacitor from the third voltage to a fourth voltage during a fourth duration, wherein N is a positive integer greater than 1, wherein the output control circuit includes a third transistor, wherein a control terminal of the third transistor is connected to the first terminal of the bootstrapping capacitor and a first terminal of the third transistor receives a first clock signal, such that the third transistor generates the corresponding one of the gate driving signals at a second terminal of the third transistor; and
a first anti-noise circuit including a fifth transistor and a sixth transistor, wherein a first terminal of the fifth transistor and a first terminal of the sixth transistor are connected to the second terminal of the third transistor, wherein a second terminal of the fifth transistor and a second terminal of the sixth transistor receive a first low system voltage, wherein a control terminal of the fifth transistor is connected to a first node, wherein a control terminal of the sixth transistor is connected to a second node.

19. A spliced display, comprising:
a plurality of display panels disposed within a display region of the spliced display, wherein the display panels are spliced to each other, wherein each of the display panels has a gate driving device, wherein the gate driving device includes a multi-stage of gate driving circuit composed of a plurality of gate driving circuits for respectively generating a plurality of gate driving signals, wherein Nth-stage of gate driving circuit comprises:
a bootstrapping circuit composed of a bootstrapping capacitor and a transistor, wherein a first terminal of the bootstrapping capacitor has a first voltage during a first duration;
a pre-charge circuit connected to the first terminal of the bootstrapping capacitor, wherein the pre-charge circuit boosts the first terminal of the bootstrapping capacitor from the first voltage to a second voltage during a second duration, wherein the bootstrapping circuit boosts the first terminal of the bootstrapping capacitor from the second voltage to a third voltage during a third duration;
an output control circuit connected to the first terminal of the bootstrapping capacitor, wherein the output control circuit boosts the first terminal of the bootstrapping capacitor from the third voltage to a fourth voltage during a fourth duration, wherein N is a positive integer greater than 1, wherein the output control circuit includes a third transistor, wherein a control terminal of the third transistor is connected to the first terminal of the bootstrapping capacitor and a first terminal of the third transistor receives a first clock signal, such that the third transistor generates the corresponding one of the gate driving signals at a second terminal of the third transistor; and
a first anti-noise circuit including a fifth transistor and a sixth transistor, wherein a first terminal of the fifth transistor and a first terminal of the sixth transistor are connected to the second terminal of the third transistor, wherein a second terminal of the fifth transistor and a second terminal of the sixth transistor receive a first low system voltage, wherein a control terminal of the fifth transistor is connected to a first node, wherein a control terminal of the sixth transistor is connected to a second node;
wherein a power bus disposed within a border region of the spliced display is composed of a first power bus line and a second power bus line, wherein the first power bus line provides the first low system voltage to the display panels, wherein the second power bus line provides a second low system voltage lower than the first low system voltage to the display panels.

* * * * *